(12) United States Patent
Zilly et al.

(10) Patent No.: US 12,344,103 B2
(45) Date of Patent: Jul. 1, 2025

(54) FIRE PROTECTION DEVICE FOR AN AT LEAST PARTIALLY ELECTRICALLY OPERATED MOTOR VEHICLE, AND FIRE SENSOR

(71) Applicant: Dr. Ing. h.c. F. Porsche Aktiengesellschaft, Stuttgart (DE)

(72) Inventors: Mathias Zilly, Pfinztal (DE); Thomas Fritz, Löchgau (DE)

(73) Assignee: Dr. Ing. h. c. F. Porsche AG, Stuttgart (DE)

( * ) Notice: Subject to any disclaimer, the term of this patent is extended or adjusted under 35 U.S.C. 154(b) by 385 days.

(21) Appl. No.: 17/362,804

(22) Filed: Jun. 29, 2021

(65) Prior Publication Data

US 2022/0048392 A1 Feb. 17, 2022

(30) Foreign Application Priority Data

Aug. 12, 2020 (DE) .................... 10 2020 121 193.7

(51) Int. Cl.
*B60L 3/00* (2019.01)
*A62C 3/16* (2006.01)
*A62C 37/36* (2006.01)
*B60L 58/10* (2019.01)
*G01R 31/00* (2006.01)

(52) U.S. Cl.
CPC .............. *B60L 3/0046* (2013.01); *A62C 3/16* (2013.01); *A62C 37/04* (2013.01); *B60L 58/10* (2019.02); *G01R 31/00* (2013.01); *G01R 31/005* (2013.01); *G01R 31/006* (2013.01); *G01R 31/008* (2013.01)

(58) Field of Classification Search
None
See application file for complete search history.

(56) References Cited

U.S. PATENT DOCUMENTS

| 9,539,448 | B2 | 1/2017 | Jung et al. |
| 10,960,246 | B2 | 3/2021 | Stadler |
| 11,318,849 | B2 | 5/2022 | Soliman et al. |

(Continued)

FOREIGN PATENT DOCUMENTS

| CN | 101138669 | | 3/2008 |
| DE | 10215353 | | 10/2003 |
| DE | 202019102367 | U1 | 6/2019 |

OTHER PUBLICATIONS

Solis Perez Edgar Roberto; Fire Suppression System For Battery Systems; Date Published May 3, 2019; DE 202019102367 U1; (Year: 2019).*

(Continued)

*Primary Examiner* — Nasima Monsur
(74) *Attorney, Agent, or Firm* — Gerald E. Hespos; Michael J Porco

(57) ABSTRACT

A fire protection device (1) is provided for an at least partially electrically operated motor vehicle for detecting a fire caused by a battery device (2) of the vehicle. The fire protection device (1) includes a fire sensor (4) that is connected operatively to a monitoring system (3). The fire sensor (4) has a monitoring current conductor (14) that is suitable and configured for being interrupted by fire-induced destruction in the event of a fire. The monitoring system (3) is suitable and configured for detecting the fire by the interrupted monitoring current conductor (14).

10 Claims, 1 Drawing Sheet

(56) References Cited

U.S. PATENT DOCUMENTS

| | | |
|---|---|---|
| 2003/0112140 A1 | 6/2003 | Everson et al. |
| 2012/0313560 A1* | 12/2012 | Hambitzer ........ H01M 10/4207 |
| | | 320/118 |
| 2017/0165513 A1 | 6/2017 | Li |
| 2018/0241092 A1* | 8/2018 | Goitsuka ................ A62C 35/10 |
| 2020/0403284 A1* | 12/2020 | Bauer ..................... B60K 1/04 |

OTHER PUBLICATIONS

Stimm Frank et al.; Battery and Battery System Having a Battery; Publication WO2016113096A1 •Jul. 21, 2016; Bosch Gmbh Robert; (Year: 2016).*

Niu et al.; Power battery fire monitoring and early warning system; Date Published Jul. 26, 2019; Inst Ind Tech Guangzhou & CAS; CN 209168357 U; (Year: 2019).*

Hwang Xuan Tang et al.; Storage Battery Unit for Electric Vehicle; Publication Date Oct. 12, 2017; Toshiba Corp; JP 2017189068 A; (Year: 2017).*

* cited by examiner

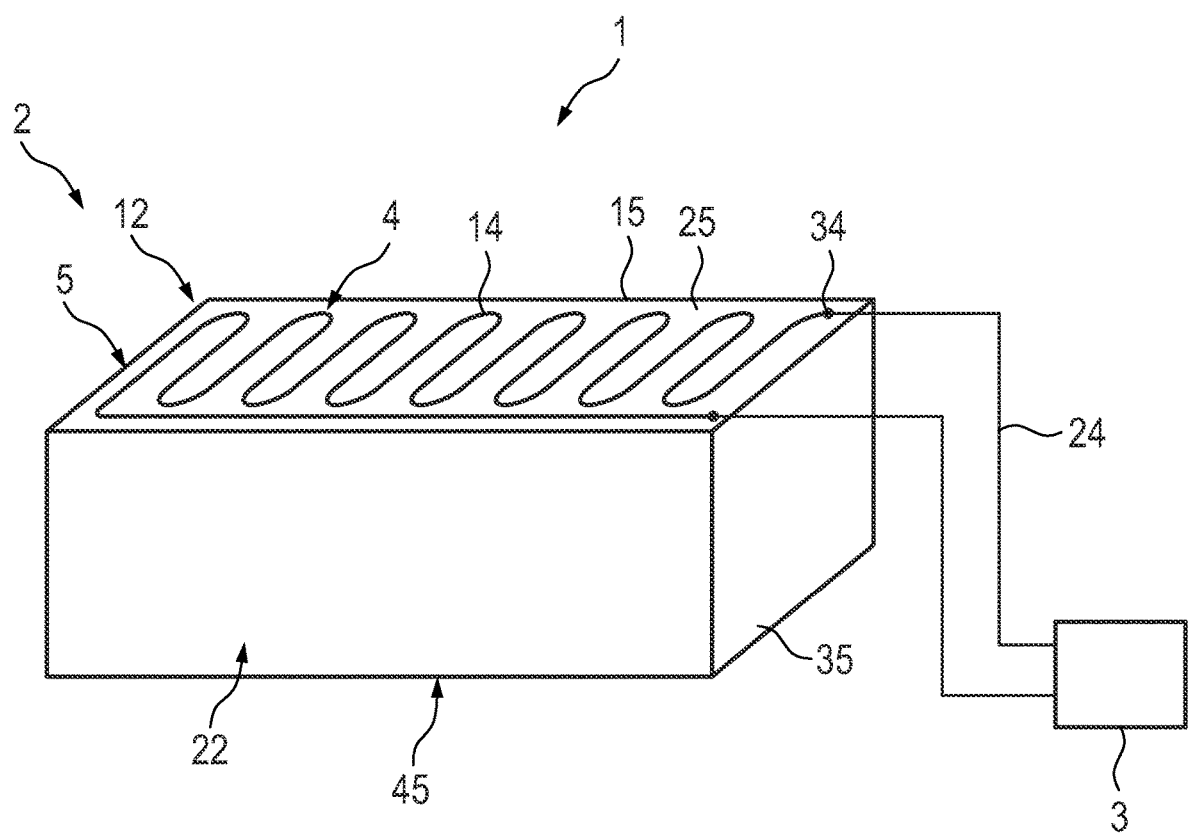

FIRE PROTECTION DEVICE FOR AN AT LEAST PARTIALLY ELECTRICALLY OPERATED MOTOR VEHICLE, AND FIRE SENSOR

CROSS REFERENCE TO RELATED APPLICATION

This application claims priority under 35 USC 119 to German Patent Appl. No. 10 2020 121 193.7 filed on Aug. 12, 2020, the entire disclosure of which is incorporated herein by reference.

BACKGROUND

Field of the Invention

The invention relates to a fire protection device for an at least partially electrically operated motor vehicle. The fire protection device detects a fire caused by a battery device of the vehicle and comprises at least one fire sensor that is connected operatively to at least one monitoring system.

Related Art

Battery-operated motor vehicles are at risk of battery fires and sometimes are equipped with systems for detecting such fires. A reliable sensor should detect in good time a fire that is starting or already has been started. More particularly, it is desirable to be able to detect the fire at a sufficiently early stage so that the driver can be warned at least five minutes before the fire spreads to the vehicle.

In view of the above, an object of the invention is to provide a fire protection device that provides quick reliable detection of fires starting in the battery device. It is also desirable to provide a fire protection device that can be produced simply and incorporated easily with a battery device.

SUMMARY

A fire protection device according is provided for an at least partially electrically operated motor vehicle, such as an electric vehicle and/or a hybrid vehicle. The fire protection device functions to detect a fire caused by a battery device of the vehicle, and in particular battery fires. Such a fire may be imminent and/or may already have broken out in the battery device. The fire protection device comprises at least one monitoring system and at least one fire sensor. The fire sensor is able to be connected, or is operatively connected, to the monitoring system. The fire sensor comprises at least one monitoring current conductor. The monitoring current conductor is configured to be interrupted by fire-induced destruction in the event of a fire that is to be detected. In particular, the electrical conductivity of the monitoring current conductor is interrupted by the fire. The monitoring system is configured for detecting the fire by means of the interrupted monitoring current conductor.

The fire protection device according to the invention offers many advantages. The fire sensor equipped with the monitoring current conductor offers a reliable and easily produced apparatus for detecting battery fires by means of a sensor. A further advantage is that a battery device, or an electrically operated motor vehicle, can be equipped particularly simply with the monitoring current conductor.

The monitoring current conductor may be arranged on a battery component. More particularly, the monitoring current conductor may be arranged on a battery module. This arrangement of the monitoring current conductor allows a fire to be detected reliably and at an early stage. The expression "battery component", as used herein, can be replaced within the scope of the invention by the expression "battery module". The battery component can also comprise other components of the battery device. For example, the battery component can be a battery housing and/or a power electronics and/or charging electronics and/or a high-voltage cable or the like.

The monitoring current conductor may be arranged on a module housing of the battery module. In particular, battery cells are housed in the module housing. The monitoring current conductor can also be arranged on a battery housing of the battery device, plural battery modules may be arranged in the battery housing.

The monitoring current conductor may be arranged on a cover and/or side part and/or base of the battery module or on the module housing of the battery module and/or battery housing. Such components advantageously can be equipped with the monitoring current conductor.

The monitoring current conductor of one embodiment extends over at least half and preferably over at least two thirds and particularly preferably over at least three quarters or over more than 90% of the width and/or length of the battery component and in particular of the battery module and particularly preferably of the module housing. The monitoring current conductor extends in that manner over the width and/or length of the cover and/or side part and/or base. In some embodiments, the monitoring current conductor runs in curved and/or angled tracks and may run in a meandering manner. A large detection range can thus be covered reliably and simply.

The monitoring current conductor of some embodiments is arranged on an outer side of the battery component and preferably of the battery module. In particular, the monitoring current conductor is arranged on an outer side of the module housing and, for example, of the cover and/or of the side part and/or of the base. However, an arrangement inside the module housing also is possible and advantageous.

In some embodiments, the monitoring current conductor is connected to the battery component and in particular the battery module permanently and/or in such a manner that it cannot be removed non-destructively. This permits advantageous production methods and also simplifies handling during assembly or installation.

The monitoring current conductor can also be connected permanently and/or in such a manner that it cannot be removed non-destructively by a carrier structure. The carrier structure may be part of the fire sensor. This permits particularly independent production of the fire sensor. The carrier structure may be able to be fastened to the battery component but also may be provided by the battery component.

The monitoring current conductor of one embodiment is connected to the battery component at the same time as it is produced. The monitoring current conductor also may be connected to the carrier structure at the same time as it is produced. These embodiments permit simple and economical manufacture.

The monitoring current conductor may be printed onto the battery component and/or onto the battery module. For example, the monitoring current conductor also may be printed onto the module housing and preferably the cover and/or the side part and/or the base of the module housing. The monitoring current conductor also can be printed onto the carrier structure. Thus, the monitoring current conductor of these embodiments is produced by a printing method.

The monitoring current conductor can be produced by an additive manufacturing method, but other manufacturing methods are possible. Printing can take the form of an additive manufacturing method or a different printing method that is suitable for the production of current conductors.

The fire protection device may comprise plural fire sensors. In particular, the battery device may comprise plural battery components and preferably plural battery modules. At least one fire sensor may be allocated at least in part to each of the battery components, in particular the battery modules. This has the advantage that the monitoring system can reliably detect a fire in a single battery component or in a battery module. This is particularly advantageous to warn the driver in good time and before the entire vehicle catches fire.

The monitoring system may be configured to identify which of the plural fire sensors has an interrupted monitoring current conductor. In particular, the monitoring system is configured for detecting, or reporting, a fire for an identified fire sensor.

The monitoring system may be configured to identify the at least one battery component that is affected by a fire by allocating of the fire sensors to the battery components. Thus, the monitoring system reports a fire for such a battery component.

The monitoring system may be configured for reporting the fire at least to the driver. Reporting to a central system and/or to the fire brigade and/or to at least one control device of the motor vehicle is also possible. For example, a visual and/or acoustic message can be given. It is also possible for a warning to be displayed, for example in a driver information system.

The monitoring current conductor may be configured to be interrupted by intentionally being destroyed at least five minutes before a fire that is to be detected spreads from the battery device to the remainder of the motor vehicle. Thus, the entire monitoring system is configured to detect the fire at least five minutes before the fire spreads from the battery device to the remainder of the motor vehicle.

The fire sensor of the invention is provided for a fire protection device as been described herein. The fire sensor comprises at least one monitoring current conductor that is configured to be interrupted by fire-induced destruction in the event of a fire that is to be detected. In particular, the fire sensor of the invention is configured as described herein with respect to the fire protection device.

The invention also relates to claim a battery device for an at least partially electrically operated or driven motor vehicle having at least one fire protection device as has been described herein.

The battery device supplies power to an electric drive system of the motor vehicle and is in the form of a high-voltage battery. The battery also can be referred to as a traction battery. A fire caused by the battery device is understood as being a fire in the battery itself and/or a fire in a high-voltage system that is connected electrically to the battery device.

The monitoring current conductor is configured to be electrically conducting and may comprise or consist of at least one electrical conductor. In particular, the monitoring current conductor is connected electrically to the power circuit of the monitoring system. In particular, the power circuit of the monitoring system is interrupted by the destruction of the monitoring current conductor. The monitoring current conductor can comprise at least two connection elements for electrical contact with the monitoring system.

The monitoring current conductor may be configured to be destroyed and thus interrupted by the action of heat caused by fire. For example, the monitoring current conductor is melted, burned or otherwise destroyed at the temperatures that are to be expected as a result of fire. In particular, purposive destruction is provided, so that the electrical power line is interrupted.

The fire protection device can comprise at least one battery device. The battery device may have at least one battery component and preferably plural battery components. Each battery component is a battery module or comprises at least one such battery module. In particular, the battery device comprises plural battery modules. Each battery module may comprise plural battery cells. In particular, the battery device comprises plural battery modules that are connected electrically to one another.

Further advantages and features of the invention will become apparent from the exemplary embodiments explained below with reference to the figure.

BRIEF DESCRIPTION OF THE DRAWING

FIG. 1 is a highly schematic illustration of a fire protection device according to the invention.

DETAILED DESCRIPTION

FIG. 1 shows an embodiment of a fire protection device 1 for detecting fires that are imminent or that have already broken out in a battery device 2. The battery device 2 is a high-voltage battery (also referred to as a traction battery) and supplies power to an electric drive system in an electric vehicle or hybrid vehicle.

The battery device 2 comprises plural battery modules 5 that are connected together. For the sake of clarity, only one of the battery modules 5 is shown here by way of example. The battery module 5 has a module housing 15 with a cover 25, side parts 35 and a base 45. Battery cells are arranged inside the battery module 15.

The fire protection device 1 comprises plural fire sensors 4 that are connected via a common monitoring current circuit 24 or each via a monitoring current circuit to a monitoring system 3. For example, each battery module 5 of the battery device 2 is equipped with one or more fire sensors 4. In addition, or alternatively, other battery components 12 of the battery device 2 also can be equipped with one or more such fire sensors 4.

The fire sensor 4 comprises a monitoring current conductor 14, which, in normal operation, forms part of the monitoring current circuit 24. The monitoring current circuit is provided, for example, with corresponding connection elements 34 for connecting the monitoring current conductor 14 to the monitoring current circuit 24.

The monitoring current conductor 14 is arranged on an outer side 22 of the battery module 5. In the example shown, the monitoring current conductor 14 is located on the cover 25. In addition, or alternatively, a monitoring current conductor 14 also can also be arranged on one or more side parts 35 and/or on the base 45. In addition, or alternatively, monitoring current conductors 14 can also be arranged on other battery components 12.

To ensure reliable detection of fires, the monitoring current conductor 14 extends over more than three quarters and over almost the entirety of the length and width of the cover 25. The monitoring current conductor 14 thereby runs in a meandering manner over the cover 25.

To permit particularly simple production and at the same time ensure safe and reliable fire detection, the monitoring current conductor 14 is printed onto the module housing 15.

The monitoring current conductor 14 is destroyed intentionally in the case of a fire or a corresponding overheating of the battery module 5 that is likely to result in a fire. The monitoring current circuit 24 thereby also is interrupted and the monitoring system 3 registers a fire. The monitoring system 3 then reports the fire and gives, for example, a warning to the driver.

The monitoring system 3 can identify the fire sensor 4 with the destroyed monitoring current conductor 14 and thus detects the battery module 5 affected by the fire.

What is claimed is:

1. A fire protection device for detecting a fire caused by a battery device in a motor vehicle that at least partially is operated electrically, the battery device having at least one battery module, the fire protection device comprising:
    a battery module housing having a base, a cover and a side part extending between the base and the cover, the battery module housing surrounding the at least one battery module;
    at least one fire sensor having at least one electrically conducting monitoring current conductor that is arranged integrally and non-removably on an outer surface of the battery module housing, the at least one electrically conducting monitoring current conductor having more than two curved or angled tracks extending in a meandering manner over at least two-thirds of a length and at least two-thirds of a width of the battery module housing and being configured to be destroyed and interrupted by a fire;
    a monitoring system connected to the at least one monitoring current conductor to form a monitoring current circuit configured to detect the fire by means of an interruption of the monitoring current conductor; and
    a warning device connected to the monitoring system and configured for generating a warning upon detection of the fire by the monitoring system.

2. The fire protection device of claim 1, wherein the monitoring current conductor is arranged on at least one of the cover, the side part and the base of the battery module housing.

3. The fire protection device of claim 1, wherein the monitoring current conductor is produced by an additive manufacturing method.

4. The fire protection device of claim 1, wherein the at least one fire sensor comprises a plurality of fire sensors and wherein the battery device comprises a plurality of battery components and wherein at least one fire sensor is allocated at least in part to each of the battery components.

5. The fire protection device of claim 4, wherein the monitoring system is configured for identifying the fire sensor that has an interrupted monitoring current conductor.

6. The fire protection device of claim 1, wherein the monitoring system is configured for reporting a visual and/or acoustic message of the fire at least to a driver who is driving the motor vehicle.

7. The fire protection device of claim 1, wherein the monitoring current conductor is connected to the battery module housing permanently and/or in such a manner that the monitoring current conductor cannot be removed non-destructively.

8. The fire protection device of claim 1, wherein the monitoring current conductor is produced integrally with the battery module housing.

9. The fire protection device of claim 1, wherein the monitoring current conductor is printed onto the battery module housing.

10. The fire protection device of claim 1, wherein the monitoring current conductor extends in a meandering manner over at least three-fourths of a length and at least three-fourths of a width of the battery module housing.

* * * * *